United States Patent
Park (10) Patent No.: US 6,215,722 B1
(45) Date of Patent: Apr. 10, 2001

(54) COMMAND LATENCY CIRCUIT FOR PROGRAMMABLE SLDRAM AND LATENCY CONTROL METHOD THEREFOR

(75) Inventor: Yong Jae Park, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/473,697

(22) Filed: Dec. 29, 1999

(30) Foreign Application Priority Data

Dec. 30, 1998 (KR) .................................................. 98-61960

(51) Int. Cl.$^7$ ....................................................... G11C 8/00
(52) U.S. Cl. ..................... 365/230.06; 365/240; 365/194; 365/233; 365/189.02; 365/230.02; 365/189.12
(58) Field of Search ........................ 365/230.01, 230.06, 365/240, 194, 233, 189.2, 230.02, 189.12

(56) References Cited

U.S. PATENT DOCUMENTS

| | | | |
|---|---|---|---|
| 5,568,445 | 10/1996 | Park et al. | 365/233 |
| 5,793,688 | 8/1998 | McLaury | 365/203 |
| 5,914,902 | 6/1999 | Lawrence et al. | 365/201 |
| 5,917,760 | 6/1999 | Millar | 365/194 |
| 5,946,245 | 8/1999 | Brown et al. | 365/201 |
| 5,953,284 * | 9/1999 | Baker et al. | 365/233 |
| 5,959,929 * | 9/1999 | Cowles et al. | 365/230.03 |
| 5,986,948 * | 11/1999 | Cloud | 365/193 |
| 6,005,823 * | 12/1999 | Martin et al. | 365/230.08 |
| 6,009,501 * | 12/1999 | Manning et al. | 711/167 |
| 6,029,250 * | 2/2000 | Keeth | 713/400 |
| 6,049,502 * | 4/2000 | Cowles et al. | 365/230.03 |
| 6,064,600 * | 5/2000 | Manning et al. | 365/189.02 |
| 6,088,774 * | 7/2000 | Gillingham | 711/167 |

* cited by examiner

Primary Examiner—Viet Q. Nguyen
(74) Attorney, Agent, or Firm—Nath & Associates, PLLC; Gary M. Nath; Harold L. Novick (57) ABSTRACT

The present invention relates to a command latency circuit for a programmable SynchLink Dynamic Random Access Memory (SLDRAM) which is an ultrahigh speed memory device. The command latency circuit for the SLDRAM includes: a command decoder unit for decoding and outputting an input of a command address; an internal clock generating unit for outputting an internal clock according to an input of a master clock while a latency is operated; a register decoder unit for receiving and decoding a register data; a burst control unit for receiving the output signal from the command decoder unit and the internal clock, and outputting a command pulse; a shift register unit for shift-outputting the output signal from the burst control unit according to an input of the internal clock; and an output unit for receiving the output signals from the shift register unit and the register decoder unit, and outputting a command signal having a wanted delay. Accordingly, the command latency circuit in accordance with the present invention can reduce the power consumption by decreasing loading of the master clock, perform a delay program by using the register, and reduce the number of the shift registers delaying the command.

19 Claims, 10 Drawing Sheets

COMMAND LATENCY CIRCUIT FOR PROGRAMMABLE SLDRAM AND LATENCY CONTROL METHOD THEREFOR

BACKGROUND OF THE INVENTION

1. Field of the Invention

The present invention relates to a semiconductor memory device, and in particular to a command latency circuit for a programmable SynchLink Dynamic Random Access Memory (hereinafter, referred to as 'SLDRAM') which is an ultrahigh speed memory device, and a latency control method therefor.

2. Description of the Background Art

As the high integration of a semiconductor memory device has been rapidly achieved, the ultrahigh speed thereof has also proceeded. Especially, the SLDRAM achieving the ultrahigh speed has been recently developed.

The SLDRAM is a kind of Dynamic Random Access Memory (hereinafter, referred to as 'DRAM'), and has a ultrahigh speed performance superior to a conventional synchronous DRAM. Especially, the SLDRAM is operated at a rising edge and a falling edge of a clock, and thus has a considerably high data bandwidth. Firstly, command signals (namely, /RAS, /CAS, /WE, etc.) and address signals which are necessary to perform a DRAM operation are inputted to the SLDRAM as a single packet four times, having a total width of 40 bits, through pins of 10 bits which are command addresses. The SLDRAM carries out the general DRAM operations (read, write, etc.) and the other specific operations by decoding the command address of 40 bits. The SLDRAM performs a bank read/write operation and a page read/write operation, and is operated at burst 4 or burst 8. In addition, during the read/write operation, the SLDRAM can adjust a time of transmitting/receiving a data to/from a controller by using an internally-stored register value. The register value can be programmed to have an appropriate value by the controller.

On the other hand, the conventional SLDRAM utilizes a master clock in a write command latency. Accordingly, there is not provided a specific logic structure for controlling the bank write operation. As a result, a write command latency circuit is operated in other operations, besides the bank write operation (for example, read latency), thereby increasing the power consumption. In addition, loading of the master clock is remarkably increased. Furthermore, many shift registers are required to delay a write command, and thus disadvantageously occupy a large area in the device.

SUMMARY OF THE INVENTION

It is therefore a primary object of the present invention to provide a command latency circuit for a programmable SynchLink Dynamic Random Access Memory (SLDRAM) which can reduce the power consumption by decreasing loading of a master clock, and a latency control method therefor.

It is another object of the present invention to provide a command latency circuit for a programmable SLDRAM which can perform a delay program by using a register, and reduce the number of shift registers for delaying a write command, and a latency control method therefor.

In order to achieve the above-described objects of the present invention, there is provided a command latency circuit for a programmable SLDRAM, including: a command decoder unit for decoding and outputting an input of a command address; an internal clock generating unit for outputting an internal clock according to an input of a master clock while a latency is operated; a register decoder unit for receiving and decoding a register data; a burst control unit for receiving the output signal from the command decoder unit and the internal clock, and outputting a command pulse; a shift register unit for shift-outputting the output signal from the burst control unit according to an input of the internal clock; and an output unit for receiving the output signals from the shift register unit and the register decoder unit, and outputting a command signal having a wanted delay.

In addition, there is provided a command latency control method for a programmable SLDRAM, including: a step for decoding and outputting an input of a command address; a step for generating an internal clock by synchronizing the decoded command wit h a master clock; a step for synchronizing the command with the internal clock, and outputting it after a predetermined delay time; a step for selecting the delayed command according to a register data ; and a step for outputting the selected command after a predetermined latency according to the register data.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A command latency circuit for a programmable SLDRAM and a latency control method therefor in accordance with a preferred embodiment of the present invention will now be described in detail with reference to the accompanying drawings.

Figure 1:
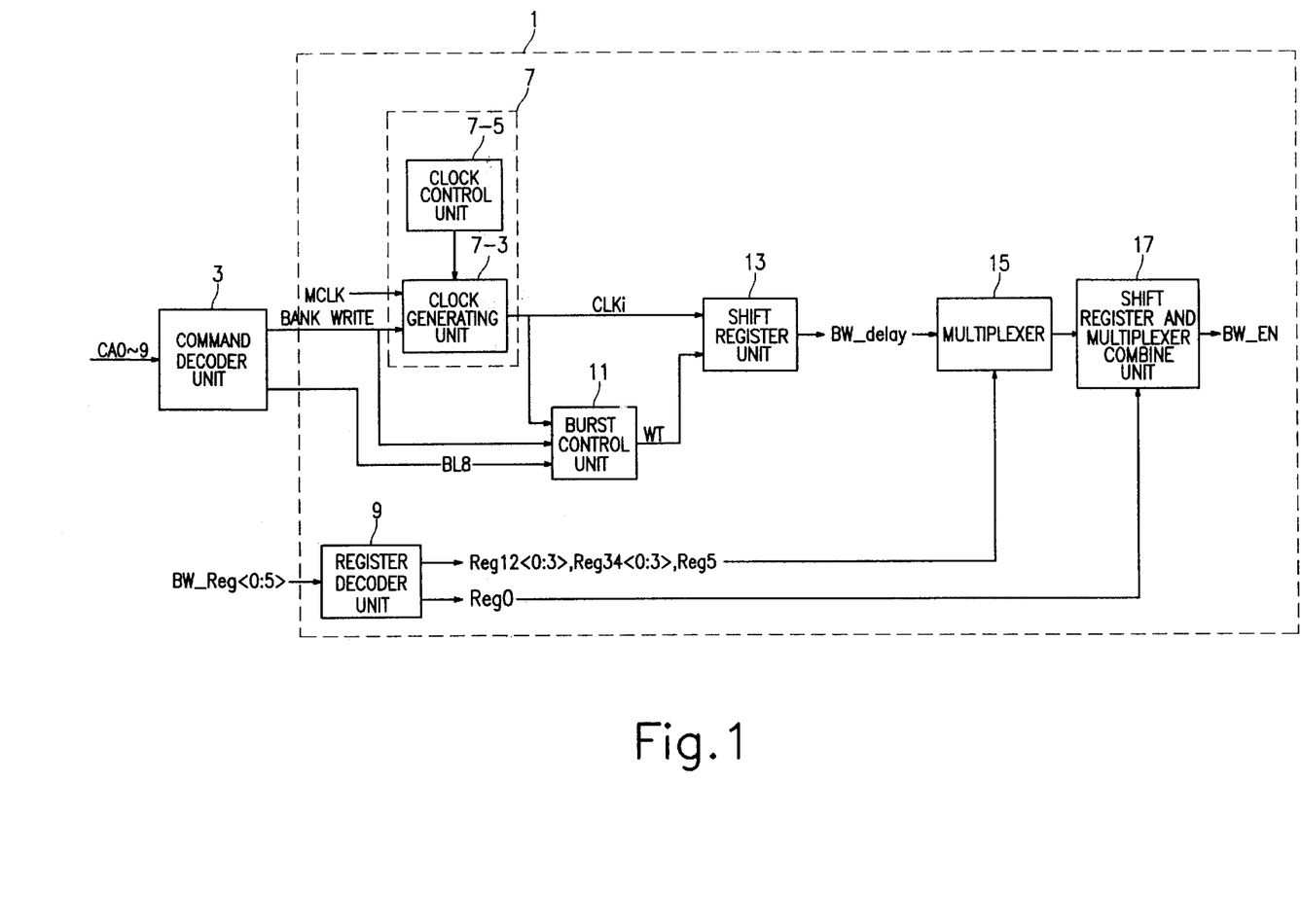
FIG. 1 is a schematic block diagram illustrating a command latency circuit for an SLDRAM in accordance with a preferred embodiment of the present invention.

FIG. 1 is a schematic block diagram illustrating the command latency circuit for the programmable SLDRAM in accordance with the preferred embodiment of the present invention. As shown therein, the command latency circuit for the programmable SLDRAM includes: a command decoder unit 3 for decoding a command address, and outputting a command and an address; an internal clock generating unit 7 for outputting an internal clock according to an input of a master clock while a latency is operated; a register decoder unit 9 for receiving, decoding and outputting a register data; a burst control unit 11 for receiving the output signal from the command decoder unit 3 and the internal clock, and outputting a write command pulse; a shift register unit 13 for shift-outputting the output signal from the burst control unit 11 according to an input of the internal clock; and output units 15, 17 for receiving the output signals from the shift register unit 13 and the register decoder unit 9, and outputting a write signal having a wanted delay. The output units include: a multiplexer unit 15 for selecting the write signal having the wanted delay or a delay —1 T by employing the decoded register data as a selection signal; and a shift register and multiplexer combine unit 17 consisting of two SRGs and a 2×1 multiplexer, for selecting a final 1 T delay by using an LSB 1 bit of the register data, and outputting the write signal having the wanted delay.

As depicted in FIG. 1, the command decoder unit 3 is a circuit for decoding the command address of 40 bits, and outputting commands and addresses which are necessary for the operation. In addition, the internal clock generating unit 7 is a circuit for receiving the master clock MCLK operated in a chip, and generating the internal clock CLKi. The clock is generated only when the latency is operated. The register decoder unit 9 receives and decodes the register data of n bits (6 bits in FIG. 1), thereby selecting the write signal having the wanted delay. The burst control unit 11 controlling a burst operation generates the write command pulse having a width of 4 Tick (hereinafter, referred to as 'T'; 1 T is half a clock cycle) in the case of burst 4, generates the write command pulse having a width of 8 T in the case of burst 8, and transmits the signal to the shift register unit 13 (hereinafter, referred to as 'SRGs'). The SRGs 13 having $2^n$ shift registers delays the write command in 2 T units, and transmits it to the multiplexer 15. The multiplexer 15 selects the write signal having the wanted delay or delay −1 T by using the register data decoded by a '$2^n$×1' multiplexer as the selection signal. The shift register and multiplexer combine unit 17 consisting of the two SRGs and the 2×1 multiplexer selects the final 1 T delay by employing the LSB 1 bit of the register data, and outputs the write signal having the wanted delay.

The command latency control method in accordance with the preferred embodiment of the present invention includes: a step for decoding and outputting an input of a command address; a step for generating an internal clock by synchronizing the decoded bank write command with a master clock; a step for synchronizing the bank write command with the internal clock, and outputting it after a predetermined delay time; a step for selecting the delayed command according to a register data; and a step for outputting the selected command after a predetermined latency according to the register data.

The detailed constitution of the programmable bank write command latency circuit in accordance with the present invention will now be explained.

Figure 2:
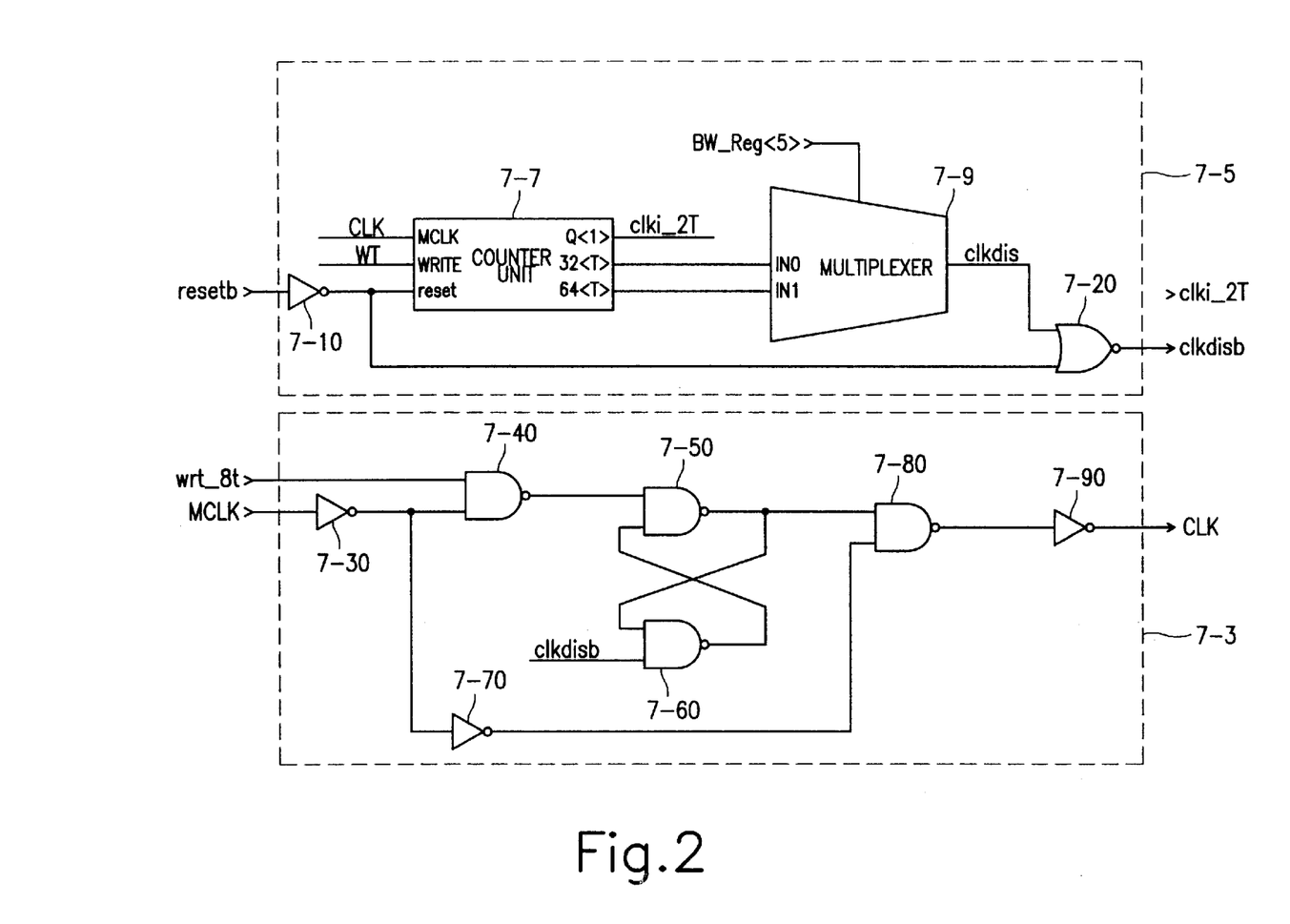
FIG. 2 is and a detailed circuit diagram illustrating an internal clock generating circuit in FIG. 1.

FIG. 2 shows an example of the clock generating circuit in FIG. 1. Reference numeral 7-3 denotes a clock generating unit for generating an internal clock clki when receiving the bank write command having a pulse width of 4 T, and maintaining the internal clock clki maximally for '64+8 T' and minimally for '32 T+8 T'. The clock generating unit 7 prevents an unnecessary short high pulse from being generated by synchronizing the write command and the master clock. Reference numeral 7-30 denotes an inverter for inverting the master clock. Reference numeral 7-40 indicates a NAND gate for NANDing an input signal from a node wrt_8t and the output signal from the inverter 7-30. Reference numeral 7-50 denotes a NAND gate for NANDing a feedback output signal from the NAND gate 7-40 and a feedback output signal from a NAND gate 7-60 discussed later. The NAND gate 7-60 receives and NANDs a feedback output from the NAND gate 7-50 and a signal clkdisb.

Reference numeral 7-80 denotes a NAND gate for NANDing the output signal from an inverter 7-70 re-inverting the output from the inverter 7-30 and the output signal from the NAND gate 7-50. The output signal from the NAND gate 7-80 is inverted through an inverter 7-90, and outputted to a terminal CLK.

Reference numeral 7-5 denotes a clock control unit for generating a signal clkdis disabling the internal clock clki by counting after a predetermined time (here, 64 T+8 T or 32 T+8 T) from the time when the internal clock clki is enabled. The clock control unit 7-5 includes: an inverter 7-10 for inverting a reset signal; a 64 T counter unit 7-7 for counting according to the output signal from the inverter 7-10, a write signal and a clock signal; and a 2×1 multiplexer for selecting one of '64 T+8 T' and '32 T+8 T' by using an MSB 1 bit of the register data. Reference numeral 7-20 indicates a NOR gate for NORing and outputting the signal clkdis from the 2×1 multiplexer 7-9 and the output signal from the inverter 7-10.

The 2×1 multiplexer 7-9 selects one of the outputs from the 64 T counter 7-7, namely '32' (actually, '32 T+8 T') and '64 T' (actually, '64 T+8 T'), by using the MSB 1 bit of the register data as a selection signal. It prevents the internal clock clki from being unnecessarily operated to 64 T+8 T, when a data value stored in the register is below 32 T (when MSB is '0').

Figure 3:
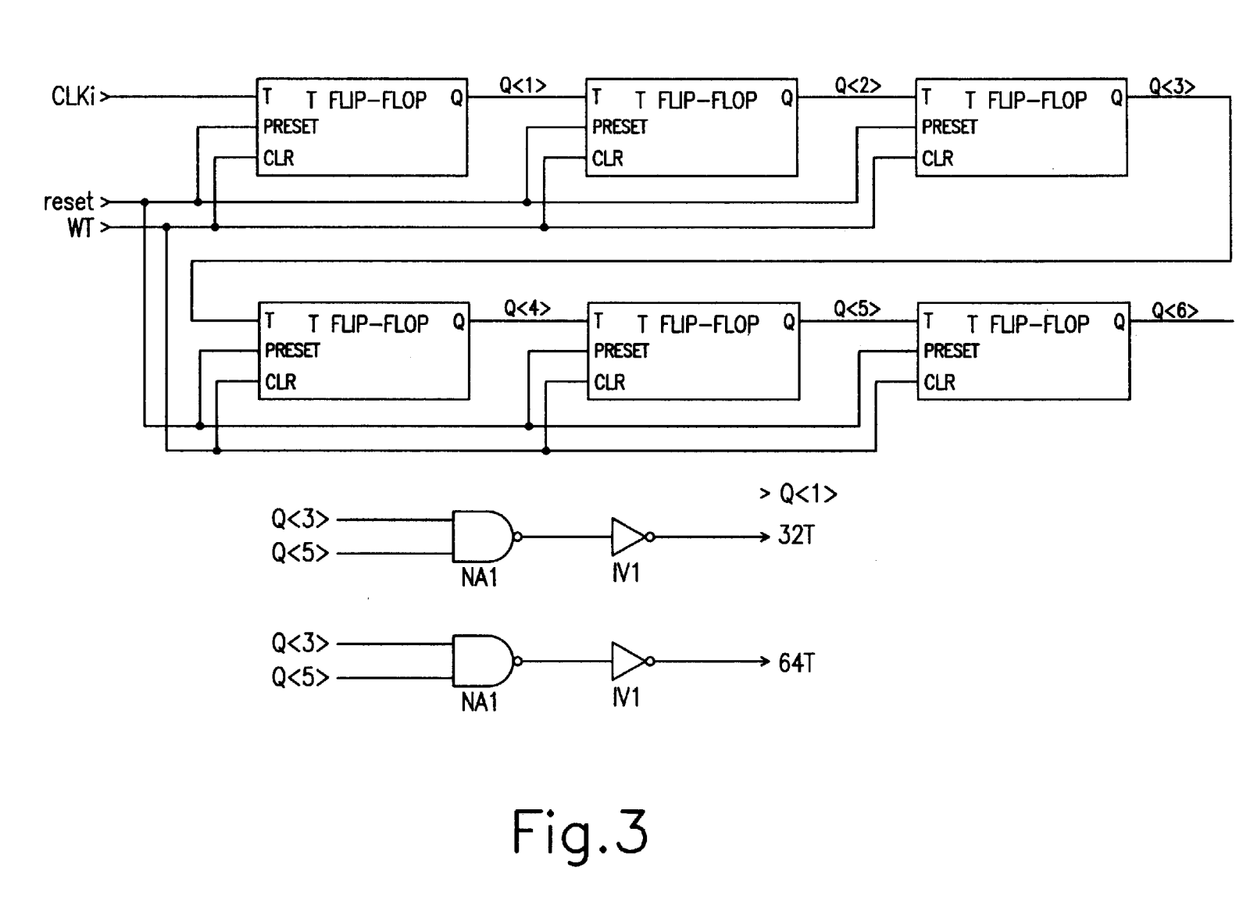
FIG. 3 is a detailed circuit diagram illustrating a 64 T counter in FIG. 2.

FIG. 3 is a detailed circuit diagram illustrating the 64 T counter 7-7 in FIG. 2. As shown therein, the 64 T counter 7-7 includes six general T flip-flops. The operation thereof will now be briefly explained. The reset signal is enabled at an initial stage, and thus all outputs from the T flip-flops are set at a logic low level. When the reset signal is disabled, the bank write command is inputted, and the internal clock clki is operated, thereby starting a counting operation. Among the outputs from the respective T flip-flops, the outputs from Q<3> and Q<5> are NANDed in the NAND gate NA1. Thereafter, the NANDed signals are inverted through the inverter IV1, and thus become an output 32 T. In addition, the outputs from Q<3> and Q<6> are NANDed in the NAND gate NA2. Then, the NANDed signals are inverted through the inverter IV2, and thus become an output 64 T. Here, in case the bank write command is re-inputted during the counter operation, the outputs from the T flip-flops are all cleared to a logic low, thereby re-starting the counting operation. Accordingly, although the identical write command is inputted during the latency operation, the internal clock clki can be maintained until the final latency output is outputted.

Figure 4:
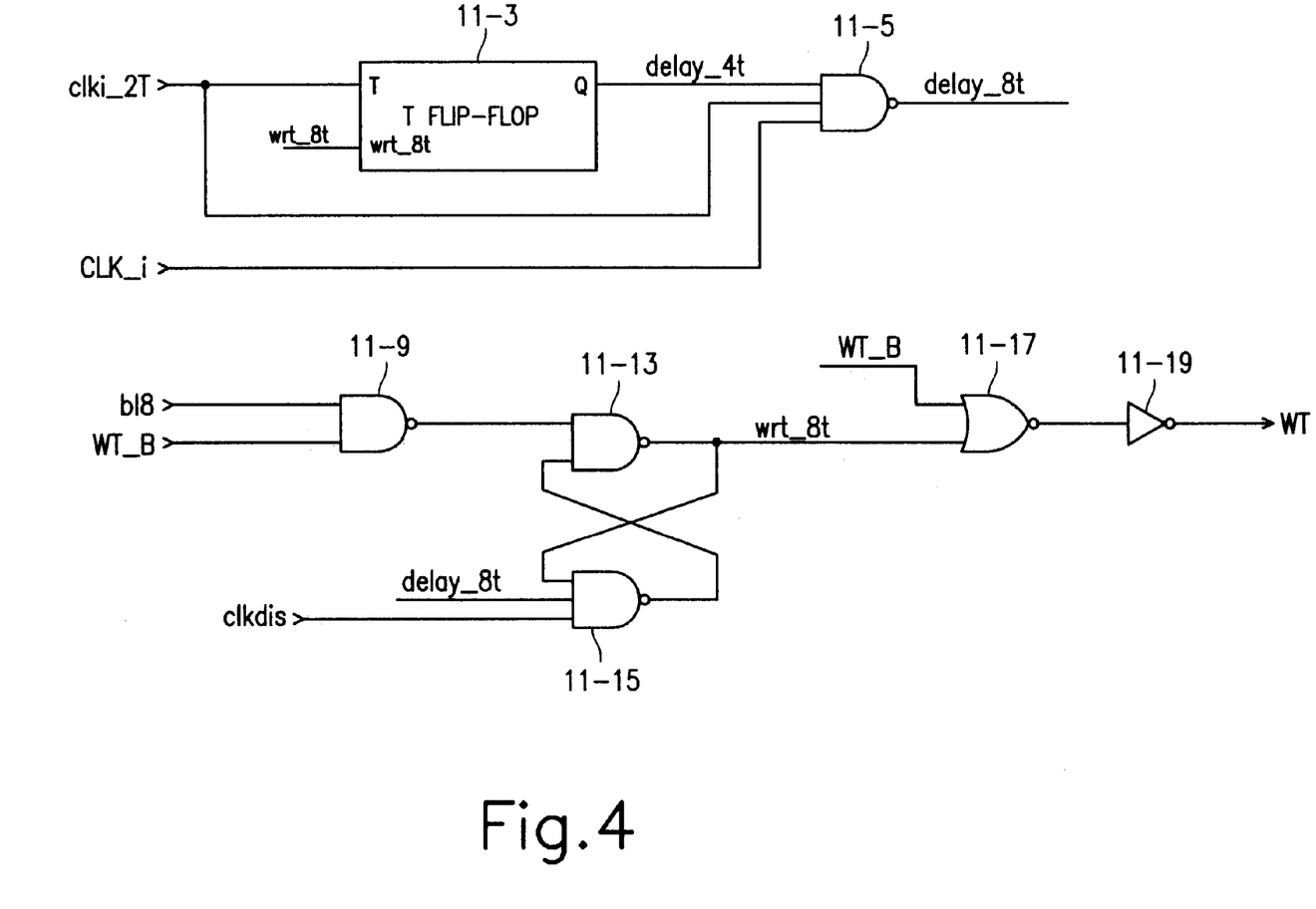
FIG. 4 is a detailed circuit diagram illustrating a burst control unit in FIG. 1.

FIG. 4 is a detailed circuit diagram illustrating the burst control unit 11 in FIG. 1. As shown in FIG. 4, a bank write command WT_B and a burst 8 signal b18 are inputted, and thus the SRGs 13 can output the bank write command of 4 T or 8 T. In more detail, the signal clkdisb resetting before the bank write command is inputted is enabled at the logic low level at an initial stage, and thus the node wrt_8t is also at the logic low level at the initial stage. As a result, since the inputs of a NOR gate 11-17 are all at the logic low level, an output signal WT is initially low. As a signal clki__2 T (clock signal having a double period of clki) and a signal delay__4t are initially at the logic low level, an output node delay__8t of a NAND gate 11-5 maintains a logic high level, and thus cannot perform the reset operation.

Figure 5:
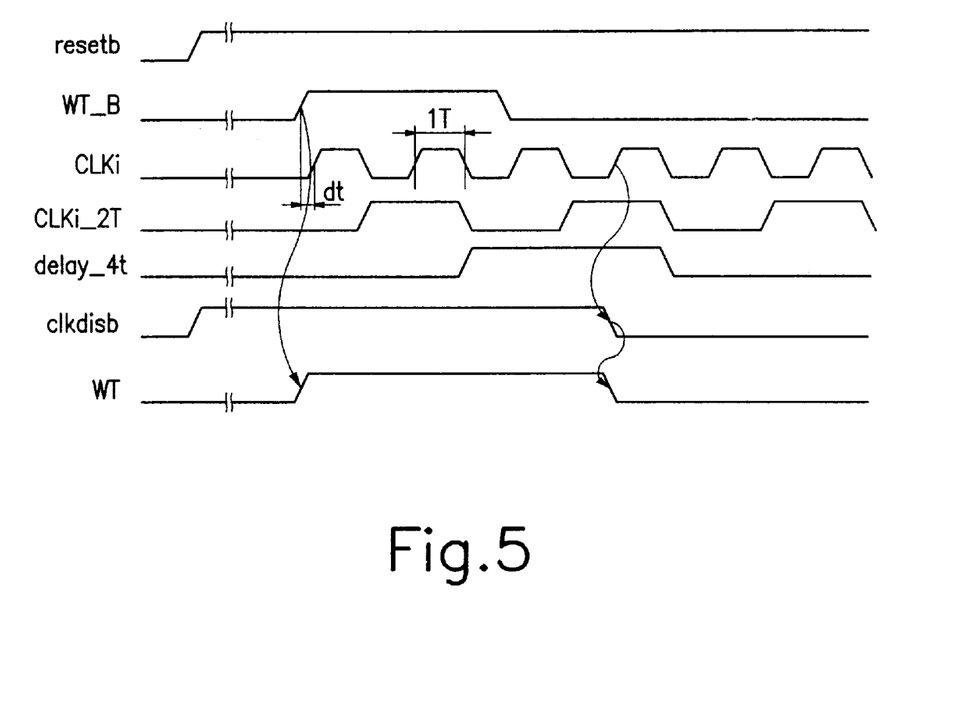
FIG. 5 is a timing diagram of a first example of burst control.
Figure 6:
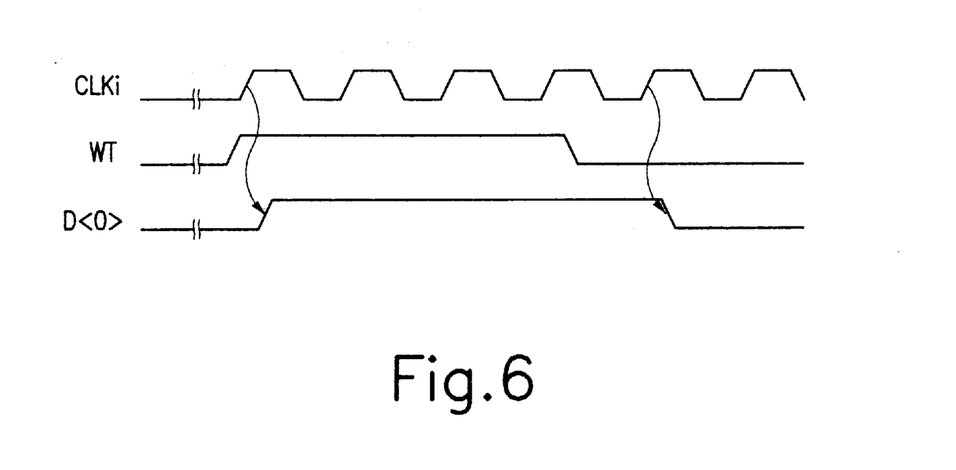
FIG. 6 is a timing diagram of a second example of burst control.

When the write operation is performed at burst 4, the signal WT__B is inputted having a high pulse width of 4 T, and at this time the signal clkdis is disabled. However, the signal b18 informing the burst 8 is at the logic low level, and thus an output from the NAND gate 11-9 maintains the logic high level, and the signal wrt__8t maintains the logic low level, as in the initial stage. The signal WT__B is inputted to one side of a NOR gate 11-17, and thus the output signal WT has a pulse maintaining the logic high level for 4 T, identically to the signal WT__B. Thereafter, when the write operation is performed at burst 8, the signal WT__B is inputted to one side of the NOR gate 11-17, and the output signal WT from the burst control unit 11 is transited from logic low to logic high. The signal b18 and the signal WT__B are inputted to the NAND gate 11-9 at an identical timing, namely having the identical high pulse width of 4 T, and thus the output from the NAND gate 11-9 becomes the logic low level, and the node wrt__8t is transited to the logic high level. When the node wrt__8t is at the logic high level, the T flip-flop 11-3 is operated. As shown in the timing diagram of FIG. 5, the node delay__4t is transited to the logic high level after a time dt+3 T from the time when the bank write command is enabled, and maintains the logic high level for 4 T. The output delay__8t from the NAND gate 11-5 is transited to the logic low level at a point dt+6 T where the signals clki, clki__2 T all become the logic high level, and thus the node wrt__8t is transited from logic high to logic low. As a result, the output signal WT has a high pulse width of dt+6 T. As described above, although the output signal WT has the high pulse of dt+6 T during the burst 8 write operation, as shown in the timing diagram of FIG. 6, an output D<0> inputted to a first D flip-flop of the SRGs 13 (refer to FIG. 7 discussed later) has a high pulse of 8 T.

Figure 7:
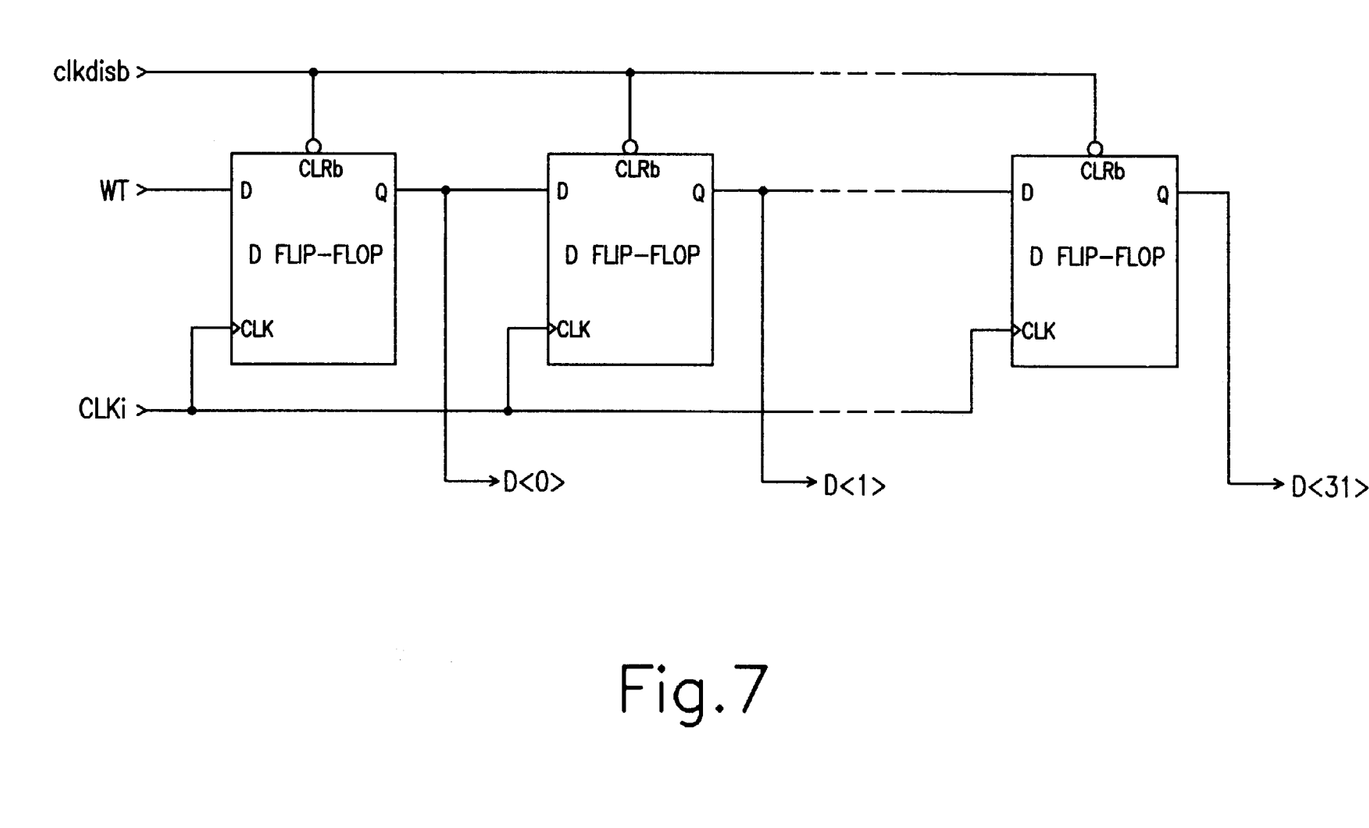
FIG. 7 is a detailed circuit diagram illustrating a shift register in FIG. 1.

FIG. 7 is a detailed circuit diagram illustrating the SRGs 13 in FIG. 1. The SRGs 13 is a shift register consisting of $2^n$ D flip-flops (here, n is a bit number of the register) which are orderly connected. An input inputted to a D node of the first flip-flop is the output WT from the burst control unit 11, and an input inputted to a CLK node thereof is the internal clock clki generated from the internal clock generating unit 7. This circuit receives the bank write command, and delays it for 2 T at every D flip-flop. The total $2^n$ outputs are outputted to the multiplexer 15. The multiplexer 15 selects one of the outputs according to the register data value, and transmits it to the SRGs+mux 17.

Figure 8:
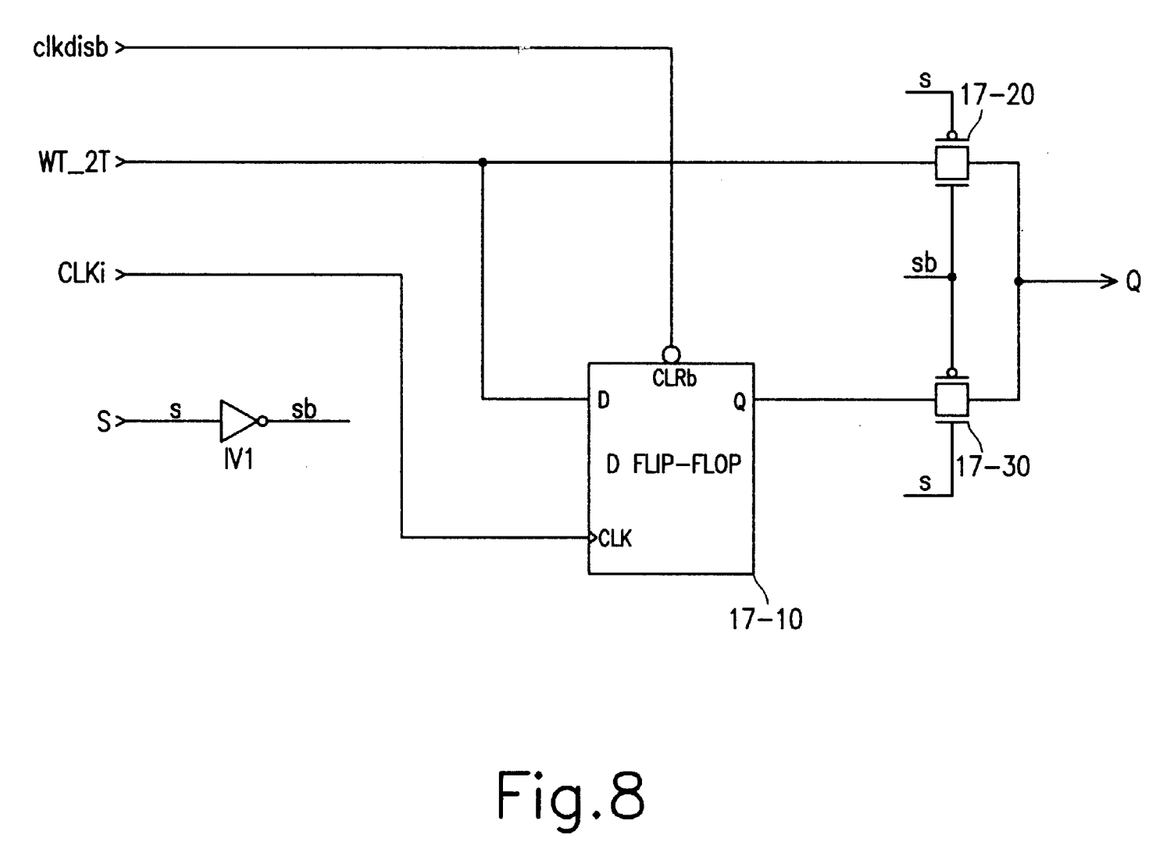
FIG. 8 is a detailed circuit diagram illustrating a shift register and multiplexer combine unit in FIG. 1.

FIG. 8 is a detailed circuit diagram illustrating the SRGs+mux 17 in FIG. 1. Here, the bank write command having the wanted delay is outputted as a final output according to the LSB 1 bit value of the register. Reference numeral 7-10 denotes a D flip-flop for receiving the disable signal clkdisb and the clock signal clki, and delaying and outputting the bank write signal WT__2 T selected by the multiplexer 15 for a predetermined time. Reference numerals 17-20 and 17-30 indicate CMOS transmission gates for respectively receiving the signal WT–2 T and the output signal from the D flip-flop 17-10, and outputting a signal according to a control signal S or Sb. Reference mark IV1 denotes an inverter.

In this specification, the bank write command latency circuit is exemplified. However, it should be recognized that the present invention may be applied to the other latency circuits, which will now be exemplified.

Figure 9:
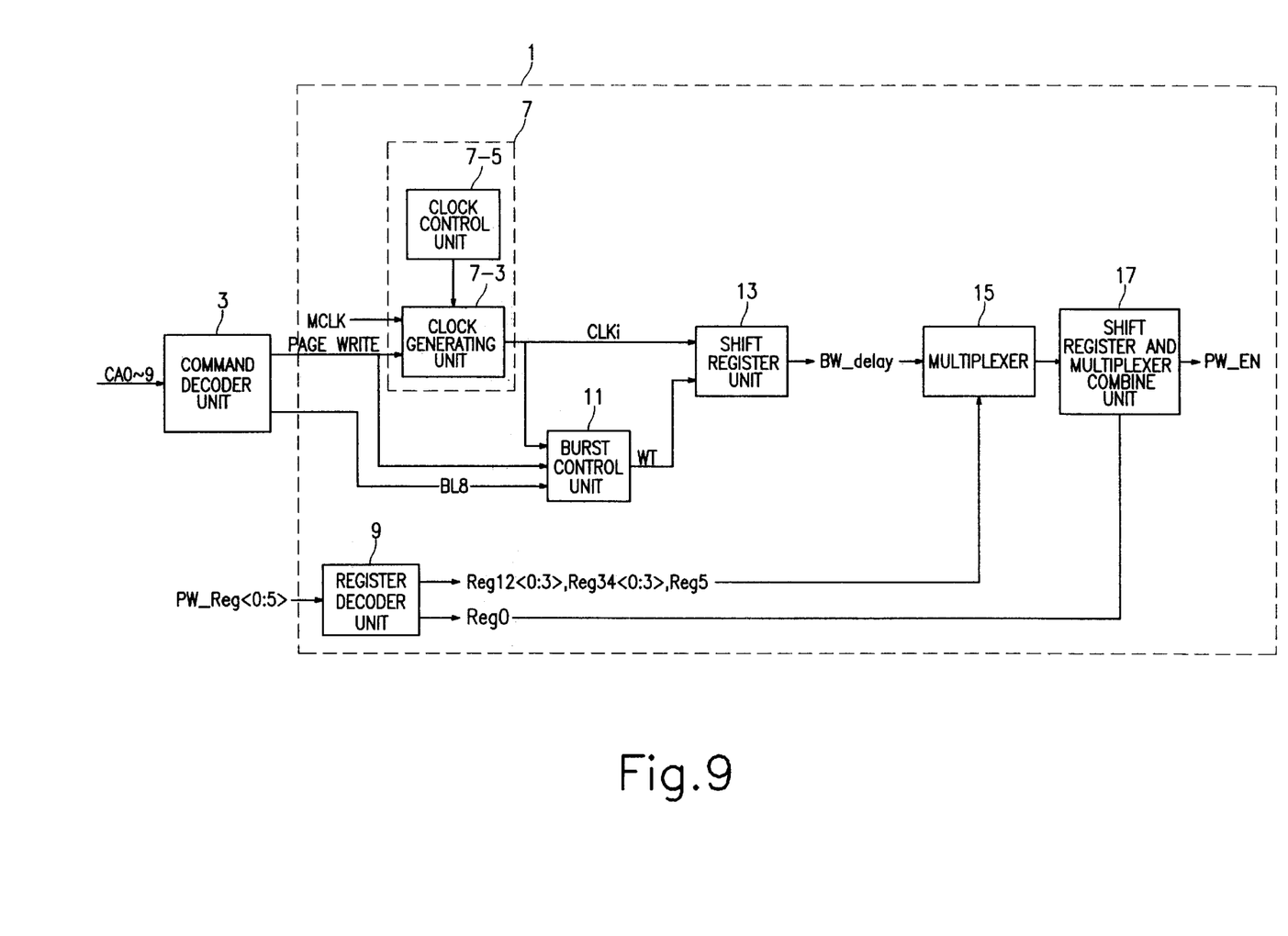
FIG. 9 is a schematic block diagram illustrating a page write latency Circuit for the SLDRAM in accordance with a method of the present invention.

FIG. 9 is a schematic block diagram illustrating a page write latency circuit for the SLDRAM in accordance with the present invention. As shown therein, a page write signal is inputted to the register decoder unit, instead of the bank write signal. Accordingly, identically to the bank write operation, the page write signal is outputted after a predetermined delay according to each register value.

Figure 10:
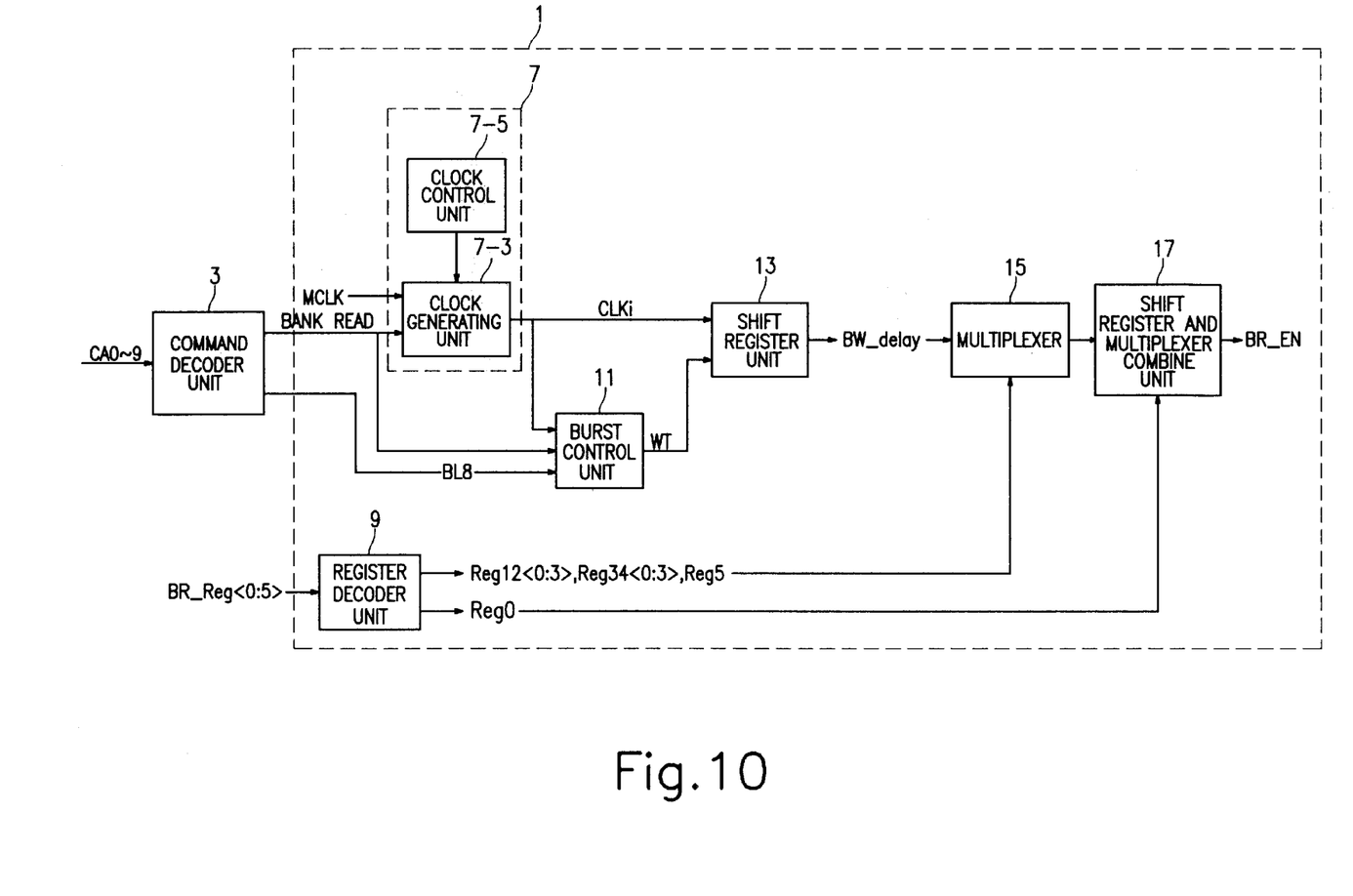
FIG. 10 is a schematic block diagram illustrating a bank read latency circuit for the SLDRAM in accordance with the method of the present invention.

FIG. 10 is a schematic block diagram illustrating a bank read latency circuit for the SLDRAM in accordance with the present invention. As shown therein, a bank read signal is inputted to the register decoder unit, instead of the bank write signal. Therefore, identically to the bank write operation, the bank read signal is outputted after a predetermined delay according to each register value.

Figure 11:
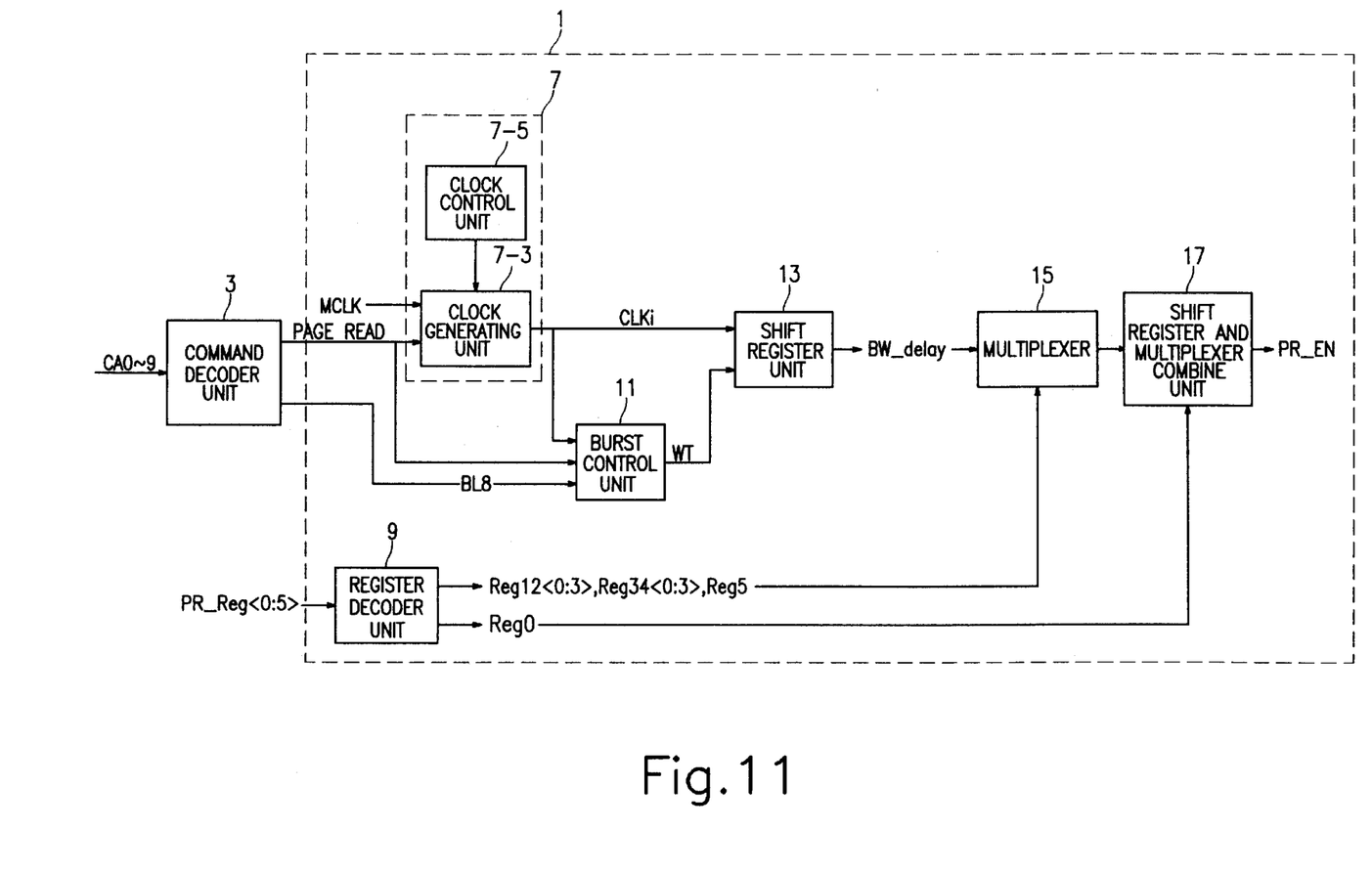
FIG. 11 is a schematic block diagram illustrating a page read latency circuit for the SLDRAM in accordance with the method of the present invention.

FIG. 11 is a schematic block diagram illustrating a page read command latency circuit for the SLDRAM in accordance with the present invention. As depicted therein, a page read signal is inputted to the register decoder unit, instead of the bank write signal. Accordingly, identically to the bank write operation, the page read signal is outputted after a predetermined delay according to each register value.

As discussed earlier, the write command latency circuit in accordance with the present invention can reduce the power consumption by decreasing the loading of the master clock, perform the delay program by using the register, and reduce the number of the shift registers delaying the write command.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A command latency circuit for a programmable synchlink dynamic random access memory (SLDRAM), comprising:
   a command decoder means for decoding and outputting an input of a command address;
   an internal clock generating means for outputting an internal clock according to an input of a master clock while a latency is operated;
   a register decoder means for receiving and decoding a register data;
   a burst control means for receiving the output signal from the command decoder means and the internal clock, and outputting a command pulse;
   a shift register means for shift-outputting the output signal from the burst control means according to an input of the internal clock; and
   an output means for receiving the output signals from the shift register means and the register decoder means, and outputting a command signal having a wanted delay.

2. The command latency circuit according to claim 1, wherein a command inputted to the command decoder means is a bank write command.

3. The command latency circuit according to claim 1, wherein a command inputted to the command decoder means is a page write command.

4. The command latency circuit according to claim 1, wherein a command inputted to the command decoder means is a bank read command.

5. The command latency circuit according to claim 1, wherein a command inputted to the command decoder means is a page read command.

6. The command latency circuit according to claim 1, wherein the output means comprises:
- a multiplexer unit for selecting the write signal having a wanted delay or a delay −1 T by employing the decoded register data as a selection signal; and
- a shift register and multiplexer combine means for selecting a final 1 T delay by using an LSB 1 bit of the register data, and outputting the write signal having the wanted delay.

7. The command latency circuit according to claim 1, wherein the internal clock generating means comprises:
- a clock generating means for generating an internal clock signal when receiving a bank write command, and maintaining the internal clock signal maximally for '64+8 T' and minimally for '32 T+8 T'; and
- a clock control means for generating a clkdis signal disabling the internal clock after a predetermined time from the time when the internal clock is enabled.

8. The command latency circuit according to claim 7, wherein the clock generating means comprises:
- a first inverter for inverting a master clock;
- a first NAND gate for NANDing an input from a wrt_8t node and the output signal from the first inverter;
- a second NAND gate for NANDing the feedback output signal from the first NAND gate and the feedback output signal from a third NAND gate;
- the third NAND gate for receiving and NANDing the feedback output from the second NAND gate and a clkdisb signal;
- a fourth NAND gate for NANDing the output signal from a second inverter inverting the output from the first inverter and the output signal from the second NAND gate; and
- a third inverter for inverting the output from the fourth NAND gate, and outputting a clk signal.

9. The command latency circuit according to claim 7, wherein the clock control means comprises:
- an inverter for inverting a reset signal;
- a counter means for performing a count operation according to the output signal from the inverter, a write signal and a clock signal, and outputting at least one signal;
- a multiplexer for selecting and outputting one of the delay signals from the counter unit by using an MSB 1 bit of the register data; and
- a NOR gate for NORing the clkdis signal from the multiplexer and the output signal from the inverter.

10. The command latency circuit according to claim 9, wherein at least one signal of the counter means is a clki_2 T signal, a 32 T signal and a 64 T signal.

11. The command latency circuit according to claim 9, wherein the multiplexer selects one of the outputs from the counter, namely '32 T' and '64 T', by using an MSB 1 bit of the register data.

12. The command latency circuit according to claim 9, wherein the counter means comprises:
- six T flip-flops for receiving and processing an internal clock signal and a reset signal;
- first and second NAND gates for respectively outputting 32 T and 64 T signals according two predetermined output signals from the T flip-flops; and
- first and second inverters for inverting the outputs from the first and second NAND gates.

13. The command latency circuit according to claim 1, wherein the burst control means comprises:
- a T flip-flop for receiving and processing a wrt_8t signal and the output signal from the counter unit;
- a fifth NAND gate for NANDing the output signal from the T flip-flop, the output signal from the counter unit, and the input clock signal;
- a sixth NAND gate for NANDing a burst 8 signal and a WT_B signal
- a seventh NAND gate for NANDing the output signal from the sixth NAND gate and the feedback signal;
- an eighth NAND gate for receiving the feedback output from the seventh NAND gate, NANDing the output from the fifth NAND gate and the clkdis signal, and feeding back it to the seventh NAND gate;
- a NOR gate for NORing the output signal from the seventh NAND gate and the WT_B signal; and
- an inverter for inverting and outputting the NORed signal.

14. The command latency circuit according to claim 6, wherein the shift register and multiplexer combine means comprises:
- a D flip-flop for receiving a clkdisb signal and an internal clock signal, and outputting a bank write signal selected by the multiplexer after a predetermined delay time; and
- CMOS transmission gates for respectively receiving the bank write signal and the output signal from the D flip-flop, and outputting an enable signal according to a control signal.

15. A command latency control method for a programmable synchlink dynamic random access memory (SLDRAM), comprising:
- a step for decoding and outputting an input of a command address;
- a step for generating an internal clock by synchronizing the decoded command with a master clock;
- a step for synchronizing the command with the internal clock, and outputting it after a predetermined delay time;
- a step for selecting the delayed command according to a register data; and
- a step for outputting the selected command after a predetermined latency according to the register data.

16. The command latency control method according to claim 15, wherein the decoded command is a bank write command.

17. The command latency control method according to claim 15, wherein the decoded command is a page write command.

18. The command latency control method according to claim 15, wherein the decoded command is a bank read command.

19. The command latency control method according to claim 15, wherein the step for outputting the selected command after a predetermined latency according to the register data selects a final 1 T delay by using an LSB 1 bit of the register data, and outputs a signal having a wanted delay.

* * * * *